United States Patent [19]
Greenberg et al.

[11] Patent Number: 5,375,074
[45] Date of Patent: Dec. 20, 1994

[54] UNBOUNDEDLY PARALLEL SIMULATIONS

[75] Inventors: Albert G. Greenberg, Millburn; Boris D. Lubachevsky, Bridgewater, both of N.J.; Israel Mitrani, Newcastle-upon-Tyne, United Kingdom

[73] Assignee: AT&T Corp., Murray Hill, N.J.

[21] Appl. No.: 468,524

[22] Filed: Jan. 23, 1990

[51] Int. Cl.$^5$ .............................................. G06F 15/60
[52] U.S. Cl. ........................................................ 364/578
[58] Field of Search .................. 364/578, 976.5, 916.3, 364/931.41; 371/23; 340/286 M, 515

[56] References Cited

U.S. PATENT DOCUMENTS

| | | | |
|---|---|---|---|
| 4,306,286 | 12/1981 | Cocke et al. | 364/200 |
| 4,751,637 | 6/1988 | Catlin | 364/200 |
| 4,814,978 | 3/1989 | Dennis | 364/900 |
| 4,866,605 | 9/1989 | Nakano et al. | 364/200 |
| 4,901,260 | 2/1990 | Lubachevsky | 364/578 |
| 4,914,612 | 4/1990 | Beece et al. | 364/578 |
| 4,930,102 | 5/1990 | Jennings | 364/900 |
| 4,942,615 | 7/1990 | Hirose | 364/578 |

OTHER PUBLICATIONS

Margolus; "Cellular-Automatic Supercomputers for Fluid-Dynamics Modelling" *Physical Review Letters* vol. 56, 1986.

Ulrich; "Serial/Parallel Event Scheduling for the Simulation of Large Systems"; Acm 1968.

Clouqueur et al; "RAPL, a Cellular Automation Machine for Fluid Dynamics"; Complex Systems 1987.

Chandy and Sherman; "Space-Time and simulation", Proceedings of Distributed Simulation 1989, Conference of the Society for Computer Simulation.

Batcher; "Sorting networks and their applications," AFIPS SJCC 32, 1968.

*Primary Examiner*—Ellis B. Ramirez
*Attorney, Agent, or Firm*—Henry T. Brendzel

[57] ABSTRACT

Efficient simulation is achieved by employing a highly efficient ordering of the events to be simulated. Specifically, the events to be simulated are grouped into layers and the layers are simulated in order. Each of the layers consists of events that are either strictly independent of the other events in the layer or are dependent of other events in the layer but possess a particular attribute. That attribute is one that permits the use of an associative operator. This operator allows the simulation of N events in O(log N) computation iterations.

33 Claims, 5 Drawing Sheets

UNBOUNDEDLY PARALLEL SIMULATIONS

BACKGROUND OF THE INVENTION

This invention relates to discrete events simulation and, more specifically, to efficient simulation of events in a multiprocessor environment.

Simulation of a discrete event system traditionally entails simulating events in time order, beginning at some initial simulated time and progressing forward in time. This approach normally utilizes a global "simulated time" clock and an event list. Formerly, simulations were performed on a single computer and events were simulated seriatim, progressing forward in simulated time. To improve simulation speed, it was natural to look at the use of more than one processor to simulate the event list and, indeed, some speed improvement was realized by employing more processors even though the basic approach remained the same. However, the improvement in simulation time came at the expense of a communication burden. The processors that did the simulating had to communicate at least some of the simulation results to other processors, and the communication burden grew very quickly as the number of processors increased.

Since the physical system that is simulated typically comprises a number of "nodes" in which events occur (the term "nodes" herein intends to encompass objects, stations, locations, etc. that are associated with events), the obvious division of labor among the processors was to assign a group of nodes to each of the cooperating processors. Restricting each processor to simulate events that occur at certain nodes, however, imposed a synchronization requirement. A processor could not be allowed to simulate events of a certain node until it was known that no node at any of the other processors would send a message that would affect the simulation of that certain node (if "back-tracking" was not to be employed). The high communication burden between the computers sparked interest in simulation algorithms that would reduce this burden. One such algorithm is described, for example, in U.S. patent application Ser. No. 07/114369, titled "Bounded Lag Distributed Discrete Event Simulation Method and Apparatus" and filed on Oct. 28, 1987, M.S. Pat. No. 4,901,260.

A recent publication by Chandy and Sherman ("Space-Time and simulation", *Proceedings of Distributed Simulation* 1989 conference of the Society for Computer Simulation), provides an overview of various simulation techniques applicable to multiprocessor arrangements. It describes an approach where the all of the events of all of the nodes at all times are treated as an a priori known whole. They depict this "whole" as a rectangle where the nodes are marked along the x axis and time is marked along the y axis. The events to be simulated are points within that rectangle or, more specifically, points along vertical time lines that are associated with the nodes.

The concept proposed by Chandy and Sherman is to divide the rectangle into a chosen number of arbitrary regions. The regions may divide the rectangle with vertical cuts and/or with horizontal cuts. The former segregates nodes while the latter segregates time. Each region represents a process that is assigned to a processor. Presumably, more than one process can be assigned to a processor. Still, having preselected the regions and made the assignments, the problem remains to determine which events will occur in which regions. This problem is not trivial. It is particularly difficult when horizontal (time) cuts are made to form the regions, because the mere knowledge that an event may occur at some node is not sufficient. In order to know which processor is to simulate an event, the event's absolute (simulated) time also needs to be known.

Chandy and Sherman propose a solution to this problem. Specifically, they suggest using estimates of the behavior of events in each region, simulating the events in the regions based on the created estimates, sending messages to neighboring regions based on the simulated events to correct the assumptions made, and repeating the simulations to account for the newly arrived messages that correct the original assumptions. This iterative "relaxation" process is repeated until the system reaches equilibrium state at which the messages sent by the processors correspond to the messages that are assumed to be received by processors.

The drawback in the Chandy and Sherman approach is that the initial assumptions made as to the events which occur in a region may be completely wrong. Since the regions are divided a priori in terms of time and nodes rather than by events, three types of errors can be made in the assumptions. Errors that relate to whether events actually occur in the region, errors that relate to the order in which those events occur, and errors that relate to the actual time (vis-a-vis the boundaries of the region) in which the events occur. Because errors in the assumptions will almost certainly be made, and since those errors and the errors they propagate must be corrected, there is little incentive to begin with any assumptions. Indeed, a close analysis of the Chandy and Sherman approach suggests that their iterative "relaxation algorithm" process works no better with some assumptions made than with no assumptions made. The consequence is that processors which handle regions of events far into the future do not perform useful work while the relaxation algorithm either establishes the proper conditions from no assumptions, or establishes the proper conditions by correcting the assumed conditions.

Another drawback of the Candy and Sherman paper is their concentration on the rectangle as a whole and the separation of the rectangle into regions. While they offer some interesting insights of the simulation task as a whole, they provide no suggestions on what are "good" region selections and what processor assignments provide faster and more efficient simulations. Consequently, although speed of simulation is one of the primary goals of simulation methods, a person who performs simulations using the Chandy and Sherman teachings but with some arbitrarily selected regions will not be likely to get the desirable effect of a high speed of simulations.

SUMMARY OF THE INVENTION

Efficient simulation is achieved, in accordance with the principles of this invention, by employing a highly efficient ordering of the events to be simulated. Specifically, the events to be simulated are grouped into layers and the layers are simulated in order. Each of the layers consists of events that are either strictly independent of the other events in the layer or are dependent on other events in the layer but possess a particular attribute. That attribute is a particular timing relationship which relates the times of the events to one another using an associative operator. In complex situations, additional dependencies between these times may be accommodated by iterative application of procedures involving merging or sorting of the events. Use of the associative operator allows the simulation of N events in a smaller number of computation iterations, such as in O(log N) computation iterations. An operator is associative when the same result is reached whether the operator is applied to a first intermediate result and event C, or to event A and a second intermediate result—where the first intermediate result is obtained by applying the operator to events A and B, and the second intermediate result is obtained by applying the operator to events B and C. One approach for creating simulation layers is to separate the events by the simulated nodes (rather than by time segments, as is typically done in prior art simulations).

DETAILED DESCRIPTION

Figure 1:
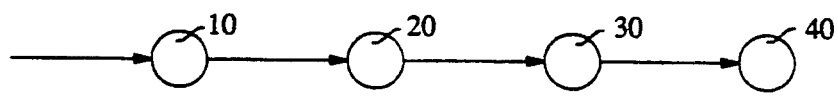
FIG. 1 illustrates a simple four-node serial connection of workstations.

To better understand our invention it is useful to center the description around a specific example. For illustrative purposes, it is assumed, that we need to simulate a system of four workstations (nodes) that are connected serially and together perform useful tasks. Depending on the application, a workstation may be a computer, a worker in a production line, a robot, etc. In this arrangement, "jobs" are applied to the first station in the serial connection at random times, and the arriving jobs have a certain mean and variance of arrival times. Each station processes the arriving jobs on a first-come first-served basis as it becomes free to do the processing. The time that is required to complete each arriving job is random. This randomness also has a certain mean and variance. When a new job arrives at a node before the previous job ended its processing, the new job is placed in a queue. Once the job is completed, it is forwarded to the next node in the serial connection, and the oldest job in the queue is taken up for processing. This arrangement is represented by FIG. 1 in the form of a directed graph. Nodes 10 through 40 represent the station, and the arrows represent the job paths.

The statistics of the arriving jobs in the FIG. 1 arrangement (e.g. the mean and variance of job arrival time intervals) are known, as well as the statistics of the time required by the FIG. 1 station to process the arriving jobs. The challenge is to efficiently determine, through simulation, the times at which jobs arrive and depart each workstation, and subsequently, to efficiently develop the histories and other statistics of the job queues in the workstations. It may be also required to compute various statistics, e.g., the mean queue length.

Figure 2:
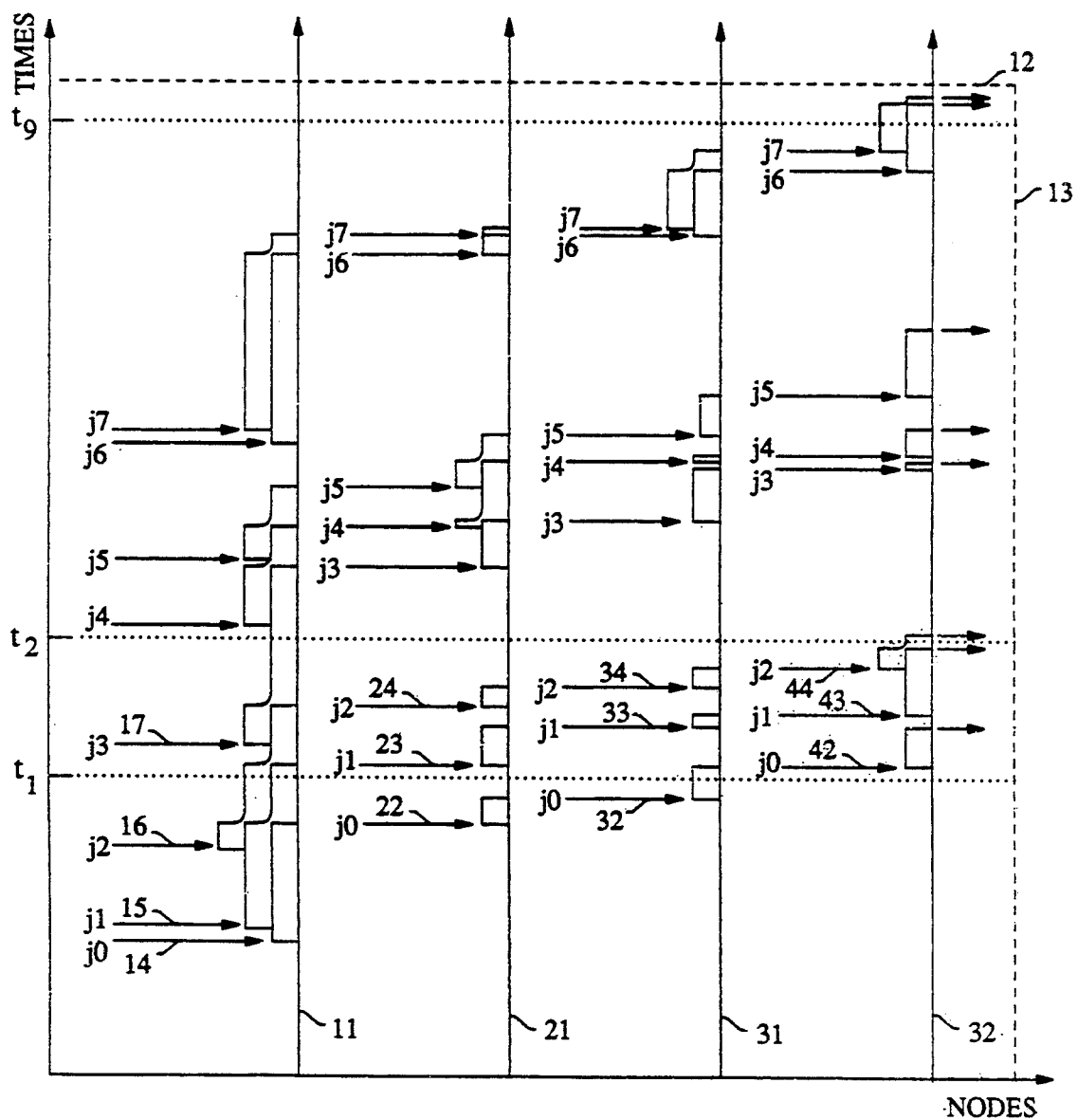
FIG. 2 depicts the simulated job arrival and departure times for the FIG. 1 system.

FIG. 2 depicts a possible scenario of job arrivals, processing and completions in the system of FIG. 1. The scenario of FIG. 2 was created randomly for the illustrative purposes of this disclosure. The horizontal axis in FIG. 2 is devoted to nodes and the vertical axis is devoted to simulated time. This configuration is the same as the one described by Chandy and Sherman in the aforementioned article. Each vertical line represents the time line of one of the nodes. Specifically, line 11 represents the time line of node 10, line 21 represents the time line of node 20, line 31 represents the time line of node 30, and line 41 represents the time line of node 40. In FIG.2, each staircase-like shape represents a job. The arrow and the lower edge of the shape represents the job's arrival, and the upper-most horizontal edge of the shape represents the job's departure. The stacking of the staircase-like shapes provides a measure of the queues at the nodes. For example, the job arrivals at node 21 correspond to the job departures at node 11; and, between the arrival of job 16 and the departure of the job corresponding to the arrival of job 22 at node 21, the queue length at node 11 is three jobs.

Although FIG. 2 shows all of the events in the time-space rectangle bounded by the x and y axes and by dashed lines 12 and 13, it should be understood that when simulation starts, neither the existence nor the times of occurrence of these events are known. This information is the immediate result of the simulation. The ultimate answers pertaining to the developed queues come from analyzing the simulated events of the completed FIG. 2. These ultimate answers are relatively easy to come by once the FIG. 2 events are simulated and, consequently, it is the efficient and fast simulation of events that this invention addresses.

As indicated above, one approach is to simulate early events first because the early events dictate the later events. This is the "natural" order. In accordance with one approach of our invention, however, simulations are performed in time slices that are explicitly defined, and the simulations are carried out without the need for "roll-back". Thus, with reference to FIG. 2, simulations begin by simulating events within time interval 0 to $t_1$, where $t_1$ is a preselected simulated time on the time axis of FIG. 2. Setting the simulation "horizon" to $t_1$ causes the simulation of job arrival events 14, 15, and 16 on line 11, the simulation of job arrival event 22 on line 21, the simulation of job arrival event 32 on line 31, and no events on line 41. Event 14 represents the arrival of job 0 at node 10, event 15 represents the arrival of job 1 at node 10, event 16 represents the arrival of job 2 at node 10, event 22 represents the arrival of job 0 at node 20, and event 32 represents the arrival of job 0 at node 30. The job departure times are also events that occur at nodes 10, 20, 30 and 40. Thereafter, having completed a slice the simulation "horizon" is advanced to a later time, such as time $t_2$ and events 17, 23, 24, 33, 34, 42, 43, and 44, are simulated. The process continues until time $t_9$, whereupon the simulating of all of the FIG. 2 events is completed. This horizontal slicing which results from the successive selection of "horizons" forms, in effect, simulation layers that are processed seriatim.

In accordance with another approach of our invention, the events to be simulated are also divided into layers and the layers are simulated seriatim. However, the layers in this approach are selected in a very different manner. Specifically, each layer contains the events whose simulations depend on no other events, depend on events that were simulated in previous layers, or depend on events in the current layer that belong to class X. Events are in class X when they can be segregated into groups and ordered so that events in a group can be simulated from events in the previous groups with the aid of an associative operator. The ordering of groups can be in a linear sequence $1\to 2\to \ldots \to i-1\to \ldots$ as in the simple case considered here, but can also be more complex; e.g., it may constitute a tree. In all cases, however, the notion of a "previous" group must be defined. In the case of a linear sequence, the previous group for group i is group $j<i$. One consequence of this attribute (belonging to class X) is that n events can be simulated in O(log n) computation iterations. When the number of the groups within a layer is large, substantial simulation speed-up is derived from the O(log n) attribute. The number of events in the conventional time slice layers is very small, and its parallelism is bounded. Not much benefit is derived, therefore, from the O(log n) attribute, even if the events do belong to class X. Thus, the benefits of our first-mentioned approach derive primarily from a different aspect of our invention. On the other hand, the number of events in a time slice along the time line is unbounded, and hence its parallelism is unbounded. Events along a time line do belong to class X, as demonstrated below.

With reference to FIG. 2, the following will show how to compute the sequence of departure events for each of the nodes in the system of FIG. 2. Computing the corresponding sequence of arrival events given the inter-arrival periods is similar. Merging the arrival and departure sequences and summing over the merged sequence treating arrivals as $+1$'s and departures as $-1$'s, procedures that can be done with great efficiency on a multiprocessor, determines the queue length history shown in the figure. The time at which the $i^{th}$ job departs from a node (and arrives at the next node) can be expressed as $$D_i = \max(A_i, D_{i-1}) + S_i \qquad (1)$$

where $A_i$ is the time of arrival of job i at the given node, and $S_i$ is the service interval for job i. Equation (1) can also be written as $$D_i = \max((A_i + S_i), (D_{i-1} + S_i)), \qquad (2)$$

and equation (2) can be written as $$D_i = A_i \cdot S_i + D_{i-1} \cdot S_i \qquad (3)$$

where unlike normal notations the ".", or product, operation represents addition, and the "+" operation represents the "max" function. Proceeding from here, $$D_{i+k} = A_{i+k} S_{i+k} + A_{i+k-1} S_{i+k} S_{i+k-1} + \ldots \\ A_{i+1} S_{i+k} S_{i+k-1} S_{i+k-2} \ldots \\ S_{i+1} + D_i S_{i+k} S_{i+k-1} S_{i+k-2} \ldots S_{i+1} \qquad (4)$$

Written in closed form, the above becomes $$D_{i+k} = \sum_{j=i+1}^{i+k} A_j \prod_{r=j}^{i+k} S_r + D_i \prod_{r=i+1}^{i+k} S_r \qquad (5)$$

Since equation (5) expresses $D_{i+k}$ in terms of $D_i$, a clearer way to express equation (5) may be through a function $H_i^{i+k}$ which operates on $D_i$ to derive the value of $D_{i+k}$; i.e., $$D_{i+k} = H_i^{i+k}(D_i). \qquad (6)$$

The question is whether the H operator (operating on the variables identified by the subscript and the superscript) can be expressed in term of the composition of H operators. If so, that would imply that $H_{i1}^{i4}(D)$ can be determined by evaluating $H_{i2}^{i4}(H_{i1}^{i3}(D))$ or by evaluating $H_{i3}^{i4}(H_{i1}^{i3}(D))$. To demonstrate that this is true, we note that $H_{i3}^{i4}(H_{i1}^{i3}(D))$ equals $$\sum_{j=i3+1}^{i4} A_j \prod_{r=j}^{i4} S_r + \\ \prod_{r=i3+1}^{i4} S_r \left( \sum_{j=i1+1}^{i3} A_j \prod_{r=j}^{i3} S_r + \prod_{r=i1+1}^{i3} S_r(D_i) \right). \qquad (7)$$

Combining terms, we get, as expected, $$\sum_{j=i1+1}^{i4} A_j \prod_{r=j}^{i4} S_r + D_{i1} \prod_{r=i1+1}^{i4} S_r. \qquad (8)$$

Similarly, $H_{i1}^{i2}(H_{i1}^{i2}(D))$ equals $$\sum_{j=i2+1}^{i4} A_j \prod_{r=j}^{i4} S_r + \\ \prod_{r=i2+1}^{i4} S_r \left( \sum_{j=i1+1}^{i2} A_j \prod_{r=j}^{i2} S_r + \prod_{r=i1+1}^{i2} S_r(D_i) \right) \qquad (9)$$

which also equals $$\sum_{j=i1+1}^{i4} A_j \prod_{r=j}^{i4} S_r + D_{i1} \prod_{r=i1+1}^{i4} S_r. \qquad (10)$$

Thus, equation (3) becomes $D^i = H_{i-1}^i(D_{i-1})$ and equation (6) can be interpreted as $$H_i^{i+k} = H_{i+k-1}^{i+k} \cdot H_{i+k-2}^{i+k-1} \ldots \\ H_{i+1}^{i+2} \cdot H_i^{i+1},$$

where · denotes function composition. Since function composition is associative, we can group the functions in any advantageous manner.

In light of the above, layers that correspond to the time lines of FIG. 2 constitute one valid layering approach in accordance with the principles of this invention. When such layers are selected, the departure times of the jobs along a time line can be evaluated iteratively as shown in the table below.

| job | initial | | iteration 1 | | iteration 2 | | iteration 3 | |
|---|---|---|---|---|---|---|---|---|
| i | T(i) | $\pi(i)$ | T(i) | $\pi(i)$ | T(i) | $\pi(i)$ | T(i) | $\pi(i)$ |
| 7 | $H_6^7$ | 6 | $H_6^7 H_5^6 = H_5^7$ | 5 | $H_5^7 H_3^5 = H_3^7$ | 3 | $H_3^7 H_{-1}^3 = H_{-1}^7$ | $-1$ |
| 6 | $H_5^6$ | 5 | $H_5^6 H_4^5 = H_4^6$ | 4 | $H_4^6 H_2^4 = H_2^6$ | 2 | $H_2^6 H_{-1}^2 = H_{-1}^6$ | $-1$ |
| 5 | $H_4^5$ | 4 | $H_4^5 H_3^4 = H_3^5$ | 3 | $H_3^5 H_1^3 = H_1^5$ | 1 | $H_1^5 H_{-1}^1 = H_{-1}^5$ | $-1$ |
| 4 | $H_3^4$ | 3 | $H_3^4 H_2^3 = H_2^4$ | 2 | $H_2^4 H_0^2 = H_0^4$ | 0 | $H_0^4 H_{-1}^0 = H_{-1}^4$ | $-1$ |
| 3 | $H_2^3$ | 2 | $H_2^3 H_1^2 = H_1^3$ | 1 | $H_1^3 H_{-1}^1 = H_{-1}^3$ | $-1$ | $H_{-1}^3$ | $-1$ |
| 2 | $H_1^2$ | 1 | $H_1^2 H_0^1 = H_0^2$ | 0 | $H_0^2 H_{-1}^0 = H_{-1}^2$ | $-1$ | $H_{-1}^2$ | $-1$ |
| 1 | $H_0^1$ | 0 | $H_0^1 H_{-1}^0 = H_{-1}^1$ | $-1$ | $H_{-1}^1$ | $-1$ | $H_{-1}^1$ | $-1$ |
| 0 | $H_{-1}^0$ | $-1$ | $H_{-1}^0$ | $-1$ | $H_{-1}^0$ | $-1$ | $H_{-1}^0$ | $-1$ |

The table demonstrates that, when there are 8 jobs, the necessary number of iterations required for developing all of the job departure times, when grouped in an advantageous manner, is bounded by $\log_2 8$, or 3. At each iteration, operators H which determine departure times are computed for jobs in the queue based on a previous computation. Each iteration also provides a pointer $\pi(i)$ for computing the operators at the next iteration. Thus, in connection with job 6, for example, the initial value is $H_5^6$ and the pointer $\pi(6)$ is set to 5. At the first iteration, the computation is based on the value in the row of event 5, operator $H_4^6$ is computed and the pointer $\pi(6)$ is set to the current pointer value $\pi(5)$ of event 5; to wit, to 4. At the second iteration, operator $H_2^6$ is computed based on the value in the row of event 4 and the pointer $\pi(6)$ is set to the current pointer value $\pi(4)$ of event 4; that is, 2. Finally, in the third iteration, operator $H_{-1}^6$ is computed based on the values in the row of event 2, and the pointer $\pi(6)$ is set to the current pointer value $\pi(2)$ of event 2, i.e., $-1$. Having the complete set of operators $H_{-1}^0, H_{-1}^1, \ldots H_{-1}^7$ at iteration 3, we can immediately compute the set of departure times $D_0 = H_{-1}^0 D_{-1}, \ldots D_7 = H_{-1}^7 D_{-1}$, where $D_{-1}$ is assumed 0.

The above table demonstrates that the events of a node can be advantageously assigned to one layer. Typically, a simulation effort involves simulating a large number of events in a node, and the assigning of a large number of events to one layer could appear, on first blush, to be disadvantageous. Actually, this works to the advantage of this invention because additional processing power can always be applied to simulate the node events in parallel, and because the class X attribute permits the overall processing of a layer to grow only as the logarithm of the number of simulated events. In an ultimately parallel environment, a processor can be devoted to the simulation of each single event in the layer (as compared to the prior art devoting of a processor to the simulation of a single node). Once a layer has been simulated, information is available to simulate the next layer. In connection with the FIG. 2 events and a layering approach based on vertical strips, the first layer would correspond to line 11, the second layer would correspond to line 21, and so forth.

In connection with the FIG. 2 events and a layering approach based on horizontal strips, the first layer would correspond to the strip bounded by (0, $t_1$), the second layer would correspond to the strip bounded by ($t_1$, $t_2$), and so forth.

Figure 3:
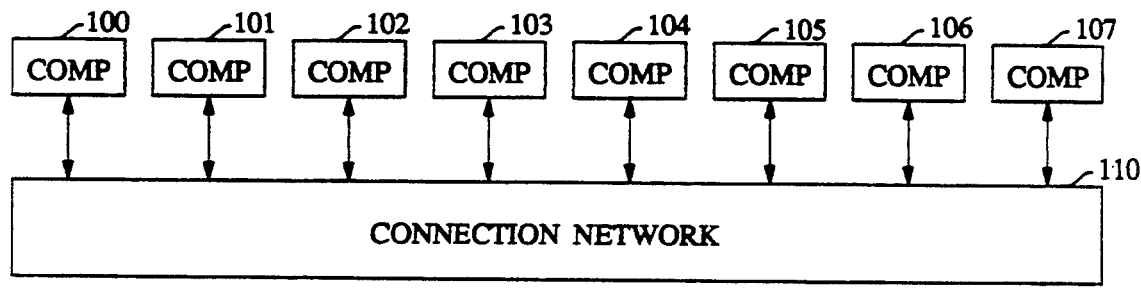
FIG. 3 presents one structural arrangement for implementing the simulations of FIG. 2.

A system for performing the simulations in accordance with the principles of our invention can have various architectures. It can comprise a single computer or many computers that are connected in a network that permits communication between the computers. FIG. 3 presents a simple organization of computers 100 through 107 that are connected to network 110. Connection network 110 can be a conventional packet transmission network, a space division switch, or the like.

Carrying out the simulations for FIG. 2, the events of time line 11 are all simulated in the system of FIG. 3 and the results are stored in the computers as inputs to the simulation of the second layer—the layer of events along time line 21. The process repeats until the events of time line 41 are simulated. It may be noted in passing that, clearly, it is possible for the number of events in a layer to far exceed the number of processors. That does not present a problem, however, because more than one event can be assigned to each processor. The assignment can be random but, most productively, a number of adjacent events can be assigned to each processor. Moreover, we need not imagine that each event is assigned to a particular processor, but that the intermediate results needed at each iteration are performed cooperatively by the available processors.

It may also be mentioned in passing that the user may not know at what simulated time to terminate the simulation. The decision to end simulations may depend, in fact, on observed results. This situation can be accommodated by selecting large number of events in a slice, treating each slice as a simulation task, and simulating each task in accordance with the disclosed principles. This is an example where the first approach of our invention (explicitly defined horizontal slices) can be combined with the second approach of our invention (vertical slices where the events are in class X). Of course, even when not combined with the second approach, when employing the first approach of our invention the total number of processors are assigned to the simulation of events in the slice. Thus, in connection with FIG. 3 and the events of the first time slice in FIG. 2, the eight processors are assigned to the 5 events in the four nodes. The amount of memory available on the machine used to perform the simulation may constrain the number of events that can be simulated concurrently. In that case, memory can be reused (e.g., using circular buffering) as the simulation proceeds.

Figure 4:
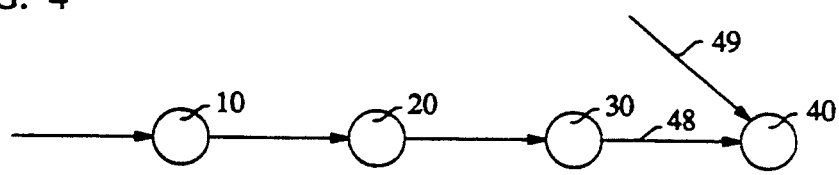
FIG. 4 illustrates a four-node serial connection of workstations with a merging input.

The FIG. 1 system is rather simple in that it contains no inputs other than the single input path to node 10. A more complex situation is depicted in FIG. 4, where another input path is provided to node 40. This additional input path, designated by arrow 48, needs to be merged with the input path emanating from node 30.

When the layer that encompasses node 40 is simulated, the structure of FIG. 4 calls for a merging of the events coming to node 40 from the two paths (the path of arrow 48 and the path of arrow 49). Merging of these events is not difficult because their times of arrival are known when merging is to proceed, and each of the input paths supplies a time-ordered, or sorted, list of events. Merging of two sorted lists is well known in the art as described, for example, in Batcher, "Sorting Networks and Their Applications", AFIPS SJCC 32, 1968.

A more complex situation results when there is feedback. Feedback occurs when the output of a node is reapplied to a previous node. Of course, there must be some control in the system to preclude overload and, typically, that involves some test that is performed on the departing jobs to determine whether they should be fed back or not. This test may be based on the nature of the job's output or it may be based on a simple job independent rule, such as "send each job back for repeated processing, but only once".

Figure 5:
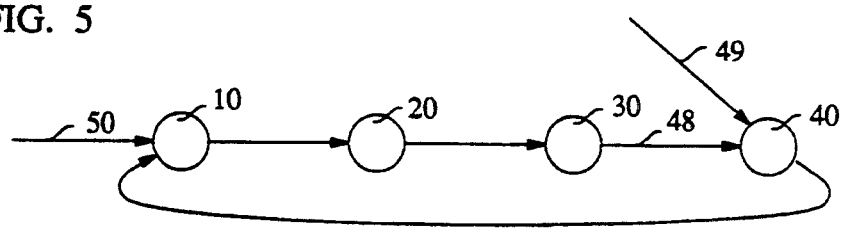
FIG. 5 illustrates a simple four-node serial connection of workstations with feedback.

FIG. 5 depicts a structure that is modeled after the FIG. 1 organization, but with a "once only" feedback path from node 40 to node 10. More specifically, in the FIG. 5 structure each job that receives service at node 10 (line 11 in FIG. 2) terminates or departs from the system. It does not re-enter node 20.

The simulations task of the FIG. 5 arrangement is not as straight forward as that of FIG. 1. The problem is that the departure times of events in node 10 are dependent on the arrival times of events from node 40, and those times are not known and cannot be directly simulated with an associative operator. To resolve this dilemma, we use a relaxation algorithm that is similar to that of Chandy and Sherman.

We start with the assumption that there is no feedback from node 40 and that the only input to node 10 is from the path of arrow 50. We then compute event departure times at node 40 (and the intermediate nodes) based on those assumptions. Thereafter, we merge the developed departure times of node 40 with the arrow 50 input and recompute the nodes' departure times. This iterative process is repeated until the developed events at an iteration are the same as the developed events at the previous iteration.

Figure 6:
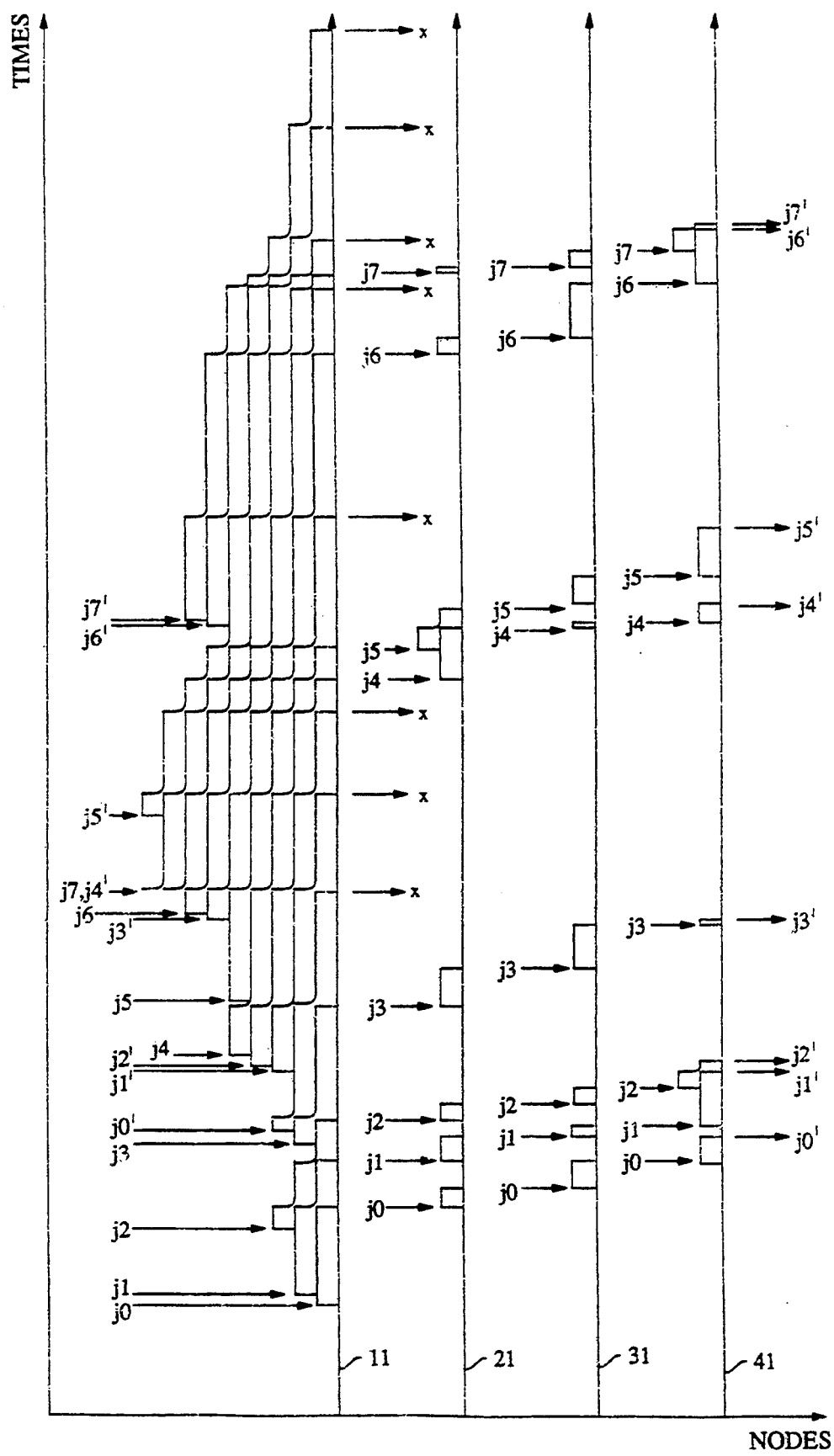
FIG. 6 depicts the simulated job arrival and departure times for the FIG. 5 system during the second iteration.
Figure 7:
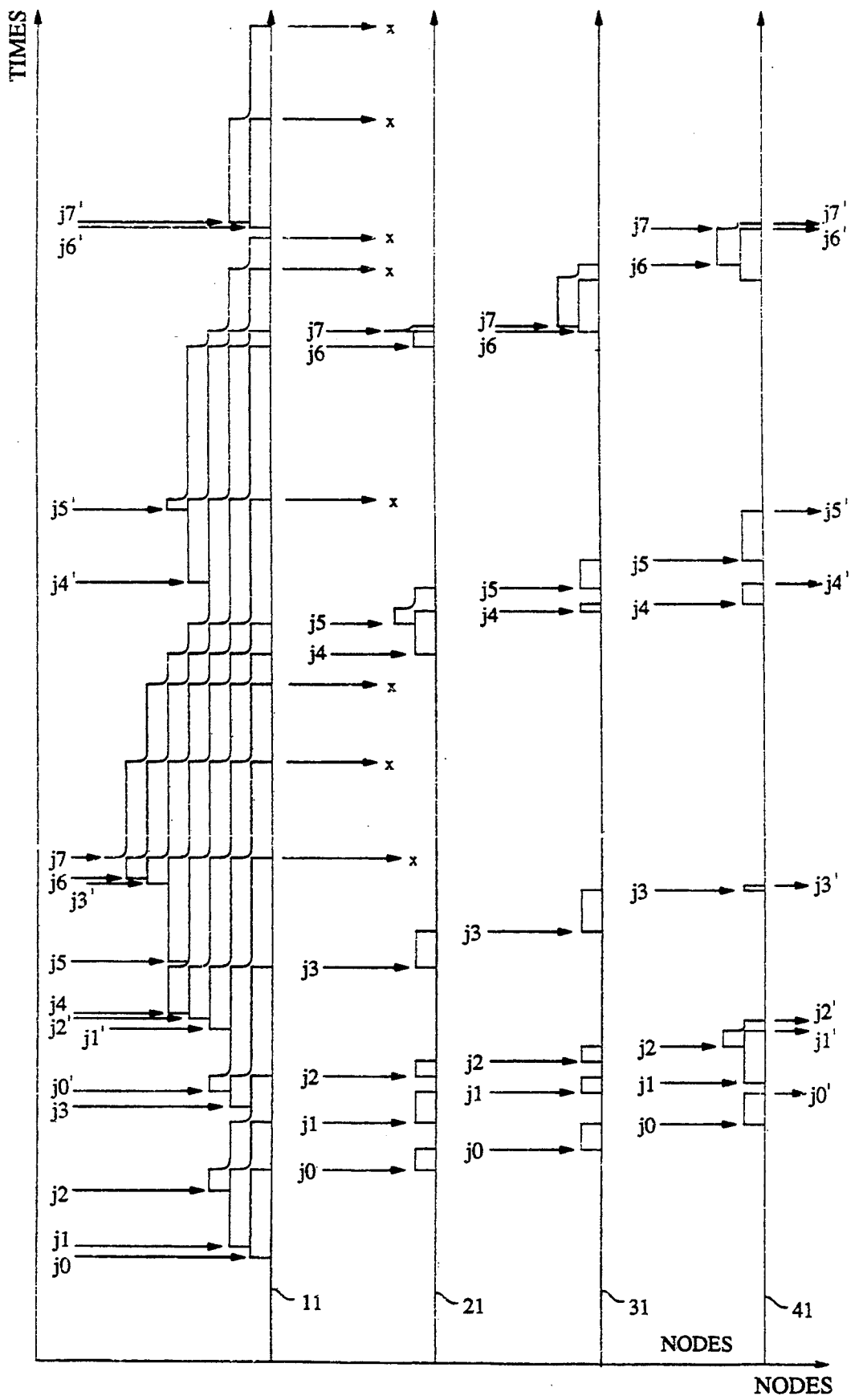
FIG. 7 depicts the final simulated job arrival and departure times for the FIG. 5 system.

FIG. 2 and FIGS. 6 and 7 demonstrate the simulation of events for the FIG. 5 system. FIG. 2 represents the first iteration, when no feedback is assumed to be present. FIG. 6 presents the event simulations of the second iteration, and FIG. 7 presents the event simulations of the third and final iteration.

The system depicted in FIG. 1 has one very simple aspect about it, and that is that node 10 is clearly the node where the simulations should start. No other node can receive jobs (directly or indirectly) from a source other than node 10. That is not to say that the simulations task cannot be performed by starting at another node. However, starting at another node would make the task take somewhat longer to complete. For example, one could assume some job entries to node 20, then simulate nodes 30, 40 and 10, iteratively correct the assumptions regarding the inputs to node 20 and the resulting outputs at node 20 until the system reaches the equilibrium.

The system of FIG. 4 has two nodes that accept jobs from outside the system (nodes 10 and 40) but here it is not quite clear that node 10 is the preferred starting node. One could start with node 40 and the inputs arriving at the arrow 49 path, while assuming some inputs from the path of arrow 48, proceeding on the basis of the known and assumed information, and correcting the assumptions when more information is known. The fact that assumptions are made and that an iterative "loop" must be engaged to correct for errors in the assumptions makes it clear that a starting node should, if possible, be one that does not require any assumptions. Stated differently, it should comprise events that are least dependent of all other nodes. In FIG. 4, the "natural" order 10, 20, 30, 40 requires no such assumptions.

The system of FIG. 5 includes a feedback path from node 40 to node 10, and that creates a situation where there are no nodes whose events are independent from all other nodes. Still, node 10 is different from nodes 20–30 in that node 10 includes an independent input from the path of arrow 50. Utilizing the available information as early as possible reduces the need for later corrections and, therefore (all things being equal), it still makes sense to start the simulations with node 10. Of course, when node 40 also had an independent input, as in FIG. 5, then node 10 and node 40 would be topographically equivalent and the simulation could start with either of the two nodes.

From the above it appears clear that the initial task in an event simulation undertaking is to analyze the directed graph that represents the system under consideration, and the rate of the flows expected along those paths. The analysis should develop an ordered list of the events to be simulated in such a way that the simulation layers encompass the largest possible number of events. When chosing to create layers that correspond to the events of nodes (as described above), the analysis should develop an ordered list of the nodes to be simulated. When developing an ordered list of nodes, the top of the list should include the nodes that are least dependent of all other nodes. This should be followed by the nodes that depend thereon, in the order of the nodes having the fewest number of input paths that depend on nodes that are below that node (in the ordered list).

Figure 8:
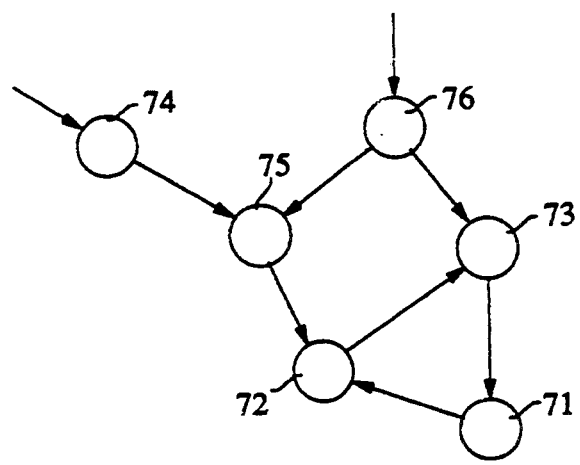
FIG. 8 presents an example of a somewhat more complex system and how the node connections affect the order of simulations.

FIG. 8 presents an example. Therein, nodes 74 and 76 are found to have only independent inputs and, accordingly, they are selected first. Their relative order is unimportant. Nodes 75 and 73 are found to be dependent on nodes 74 and 76 and, therefore, they should be selected next. However, node 73 is also dependent on nodes 72 and 71, which as yet are not in the list and hence potentially below node 73 in the list, while node 75 is dependent on no nodes that are not already included in the list. Accordingly, node 75 is selected first, followed by node 73. At this point the list comprises, in order, nodes 74, 76, 75, and 73. Next, node 71 is determined to be the only remaining node that depends on any of the nodes included in the list (depends on node 73) and, therefore, it is selected next for the list. Lastly, node 72 is selected because it depends on node 71 (and because it is the last remaining node to be included in the list). The above procedure is circumscribed by the following two procedures:

1. select the node(s) that depend on no unknown inputs or, stated differently, that depend on no nodes that are not already in the list. Repeat until all nodes are exhausted or until no some nodes remain but the remaining nodes fail to meet the above criteria. In such a case, go to step 2.
2. Of the remaining nodes, from among the nodes that depend on nodes that are already in the list, select the node that depends on the fewest number of nodes that are not already in the list. If there is more than one such node, select one arbitrarily. Having made the selection, return to step 1.

Having created the basic list, the procedure is to execute the simulations in the list, and to repeat the simulations in the list, in order, until the equilibrium is reached. We found that the needed number of repetitions is very small; usually, on the order of log N, where N is the number of events to be simulated.

Generalizing on the above, any directed graph can be analyzed to form an ordered list as described above.

Creating the list when the graph is acyclic is straight forward. When the graph has cycles, however, the situation is somewhat different.

One approach for dealing with a directed graph that include cycles is to redraw the graph in a form that is devoid of cycles. This is accomplished by representing the cycles encompassed by each strongly connected component as a single node. A strongly connected component is the set of all nodes, and the corresponding links, that are mutually reachable from any of the nodes within the set. Having developed an acyclic representation of the directed given, parent, graph, the ordered list can be created and simulated. In the course of simulating the strongly connected components in the list, the structure of the strongly connected component is analyzed as an independent graph with the appropriate entry points from the parent graph. The event list developed for the strongly connected component is simulated the necessary number of times until equilibrium is reached before the next node in the parent list is simulated.

The above description presents the principles of this invention by way of specific techniques and examples, but it should be appreciated that many variations can be made without departing from the spirit and scope of this invention. For example, when chosing to develop simulation layers by creating vertical strips that encompass the events of a node, there is no reason to insist that each strip include one and only one node. Indeed, in connection with FIG. 8, the analysis revealed the interesting situation that nodes 76 and 74 are interchangeable in the ordered list. That implies that nodes 74 and 76 can be combined into a single layer. When enough processing power is available, such combining can further speed up the simulations.

Another interesting situation results when the entire directed graph is a strongly connected component without any entry points. An example of that may be a ring network of 5 workstations with 10 tokens constantly circulating from one workstation to the next. It can be shown that the 50 events which represent the set of 10 token-processing jobs that pass through the 5 workstations can be considered as a group, because an associative operator can be found for the resulting groups. This 50-event group is qualitatively similar to the one-event group represented above by $D_i$. The number of such groups will be of order of N where N is the number of simulated events, so the available parallelism, as before, is still of order of N.

Still another interesting situation results when workstations have limited input buffers which prevent the nodes from creating boundless job queues. It can be shown that in this situation, order of N groups of certain sets of events may be formed across all nodes, and that an associative operator can be found for these groups.

Yet another interesting situation that benefits from the principles of this invention is found in the ALOHA protocol. In the ALOHA arrangement, a plurality of workstations communicate over a common channel. When a collision of communication packets occurs, the protocol calls for the colliding workstations to be informed of the collision. Each of the involved stations waits a random interval and then attempts to retransmit. This situation employs the associative operator to determine the simulated departure times, and merging procedure to reinsert the retransmission events into the events set. The number of groups for application of the associative operator is of order N, so it would take order of log N iterations to complete the simulation.

Event situations where different jobs have different priorities can be handled with this invention. For example, when jobs appear with one of two priorities, the higher priority jobs can be handled first, as if the other priority jobs did not exist, and then the lower priority jobs would be handled.

Another aspect of job simulations that imparts a "priority" flavor is related to the physical limitations that the simulation system of FIG. 3 may possess. Specifically, all systems in today's architectures have a memory size limitation, and this memory limitation may impose an ordering of the simulated events. For example, in connection with the FIG. 4 arrangement, if the events arriving at node 10 arrive earlier than the events arriving at node 40 (path 49) and the number of such events is large enough to pose a memory overflow concern, it makes sense to devote more resources to simulating the events of node 10 than to simulating the events at node 40. Because of the complexity inherent in the novel concept of the "associative operator", the above description concentrates on the "vertical" layers are applicable to other layering approaches including, specifically, the "horizontal" layering approach described above. Indeed, it may be pointed out that in some situations the second approach of our invention, where "horizontal", or "time", slices are selected in an explicitly defined manner and all of the processing power is devoted to simulating the slices to completion in a seriatim manner, may be better than the "vertical" layering approach. As an example of such a situation, one might have (some time in the future) a massively parallel processor with perhaps 1,000,000 individual processors working in parallel, for the system to be simulated consists of 1,000 nodes. Assigning all 1,000,000 computing units for processing events in the first node, then the second node, in the chosen order is clearly possible (in accordance with the above-described principles of our second approach) it may be not advantageous. There simply may not be a need to simulate the system a million events into the future of each node. Instead, one might employ the first approach of our invention, define horizontal time slices (perhaps so that each node has about 1,000 events to process in each slice) and assign the 1,000,000 processors to simulate the 1,000 events in each of the 1,000 nodes.

We claims:

1. A method for simulating on a computer events of a system comprising the steps of:
    selecting a cluster of events of said system that includes primarily events that are related to each other through an associative operator, an operator being associative when the same result is reached whether the operator is applied to a first intermediate result and event C, or to event A and a second intermediate result—where the first intermediate result is obtained by applying the operator to events A and B, and the second intermediate result is obtained by applying the operator to events B and C;
    simulating the events of said cluster of events; and
    returning to said step of selecting when at least some of said events of said system have not been simulated.

2. The method of claim 1 wherein said step of selecting excludes events that belong to another cluster.

3. The method of claim 1 wherein said step of simulating, when simulation information about events in other clusters is required, utilizes the simulation information of said events in other clusters developed by preceding steps of simulating, and makes assumptions about the simulation information of said events in other clusters to which said step of simulating was not applied.

4. The method of claim 3 wherein said steps of selecting, simulating and returning form a sequence of cluster simulations, and at least a portion of said sequence is repeated until the simulation information for all of the events in repetition k of said sequence, where k is an integer, is the same as the simulation information for all of the events in repetition k-1 of said sequence.

5. A method for simulating on a computer events of a system comprising the steps of:

selecting a layer of events of said system that includes mostly event groups that are related to each other through an associative operator, an operator being associative when the same result is reached whether the operator is applied to a first intermediate result and event C, or to event A and a second intermediate result—where the first intermediate result is obtained by applying the operator to events A and B, and the second intermediate result is obtained by applying the operator to events B and C;

simulating said layer of events; and returning to said step of selecting when at least some of said system events have not been simulated.

6. The method of claim 5 wherein said step of selecting excludes events that belong to another layer.

7. The method of claim 5 wherein said step of simulating, when simulation information about events in other clusters is required, utilizes the simulation information of said events in other clusters developed by preceding steps of simulating, and makes assumptions about the simulation information of said events in other clusters to which said step of simulating was not applied.

8. The method of claim 5 wherein said steps of selecting, simulating and returning form a sequence of cluster simulations, and at least a portion of said sequence is repeated until the simulation information for all of the events in repetition k of said sequence, where k is an integer, is the same as the simulation information for all of the events in repetition k-1 of said sequence.

9. The method of claim 5 wherein the event groups that are related to each other through an associative operator are such that the groups can be ordered and the events of a group can be simulated from the events of some previous groups with the aid of said associative operator.

10. The method of claim 5 wherein said system comprises a plurality of interacting nodes and each of said layers comprises primarily the events of one of said nodes.

11. The method of claim 5 wherein said system comprises a plurality of interacting nodes and each of said layers consists the events of one of said nodes.

12. The method of claim 5 wherein said step of simulating a layer includes a step of merging the events of other layers that affect said layer.

13. The method of claim 5 wherein said step of simulating a layer includes the steps of merging the simulated events of layers that affect said layer and that have been previously simulated; and merging assumed events of layers that affect said layer but which have not been previously simulated.

14. The method of claim 13 wherein said steps of selecting, simulating and returning from a sequence of cluster simulations, and at least a portion of said sequence is repeated until the simulation information for all of the events in repetition k of said sequence, where k is an integer, is the same as the simulation information for all of the events in repetition k-1 of said sequence.

15. A method for discrete event simulation on a computer of system events occurring in a plurality of nodes in a multi-node system, where events in one node correspond to a time interval having more than one time sample and affect events in another node, comprising the steps of:

selecting the events of a node;

simulating events of the selected node; and returning to said step of selecting until the last node in said order has been simulated and all events have been simulated.

16. The method of claim 15 wherein said simulating comprises simulating departure times of jobs.

17. The method of claim 15 wherein said simulating is carried out with the aid of an associative operator.

18. The method of claim 17 wherein said associative operator includes a "max" function which selects the larger of said two inputs.

19. The method of claim 15 wherein said step of selecting includes a step of formulating a simulations order of said nodes.

20. The method of claim 19 wherein said step of formulating a simulations order is based on an acyclic directed graph representation of said system, which graph comprises at least one node from the set of nodes that includes strongly connected component nodes and non-strongly connected component nodes.

21. A method for discrete event simulation on a computer of system events occurring in a plurality of nodes in a multi-node system, where events in one node correspond to a time interval having more than one time sample and affect events in another node, comprising the steps of:

formulating a simulations order for simulating said nodes;

designating said the first node in said order as the simulation node;

simulating events scheduled for said simulation node;

designating a new simulation node by selecting the node that follows, in said order, the current simulation node; and returning to said step of simulating until the last node in said order has been simulated and all events have been simulated.

22. The method of claim 21 wherein said step of formulating a simulations order comprises:

attaining a directed parent graph to represent the interaction of said plurality of nodes;

creating an acyclic directed graph from said directed parent graph by representing each strongly connected component in said parent graph by node;

selecting a node in said acyclic directed graph that is dependent on the fewest number of other nodes in said acyclic directed graph;

assigning the selected node to a list when the selected node is nonstrongly connected component node;

developing a sublist when the selected node is a strongly connected component node and appending said sublist to said list; and returning to said step of selecting until the last node in said acyclic directed graph has been selected.

23. A method for discrete event simulation on a computer of system events occurring in a plurality of nodes in a multi-node system, where events in one node correspond to a time interval having more than one time sample and affect events in another node and where the termination of the appearance on independent events at one or more of the system nodes is not known, comprising the steps of:

selecting a super-group of events;

for events within the selected super-group, executing a simulation procedure including selecting a cluster of events from among the events within the selected super-group, which cluster includes primarily events that are related to each other through an associative operator;

simulating the events of said cluster of events; and returning to said step of selecting when at least some of said events of said system have not been simulated;

selecting another super-group of events; and returning to said step of executing a simulation procedure.

24. The method of claim 5 wherein said step of simulating develops an order of simulating the events in said layer.

25. The method of claim 24 wherein said order is related to priority of the events being simulated.

26. The method of claim 24 wherein said order is related to constraints of hardware in which said method of simulating is carried out.

27. The method of claim 24 wherein said order is related to memory constraints of hardware in which said method of simulating is carried out.

28. The method of claim 1 wherein said step of selecting selected the events of a cluster based on said associative operator.

29. The method of claim 1 wherein said step of simulating simulates the events with the aid of said associative operator.

30. The method of claim 1 wherein said step of selecting selected the events of a cluster based on said associative operator, and said step of simulating simulates the events with the aid of said associative operator.

31. A method for simulating events of a system with an available number of processors comprising the steps of:

dividing the events to be simulated into layers having defined interface borders between the layers where at least in some of the layers one of the events in a layer is causally related to at least one other event in the layer;

selecting an order of simulation for simulating said layers; and simulating the layers in a seriatim manner, where each step of simulating a layer completely simulates the layer by employing essentially all of the available number of processors.

32. The method of claim 31 wherein said step of dividing the events to be simulated creates clusters of events where each cluster of events of said system includes primarily events that are related to each other through an associative operator.

33. The method of claim 31 wherein said step of dividing the events to be simulated creates clusters of events where each cluster of events of said system includes events within a lower border and an upper border of the simulated time where the lower border and the upper border encompass events of more than one particular time.

* * * * *